United States Patent
Maerkle et al.

(10) Patent No.: US 12,414,253 B2
(45) Date of Patent: Sep. 9, 2025

(54) CONTROL DEVICE AND MANUFACTURING METHOD

(71) Applicant: Robert Bosch GmbH, Stuttgart (DE)

(72) Inventors: Jens Maerkle, Buehl (DE); Didier Weber, Krautergersheim (FR); Manfred Burkart, Iffezheim (DE); Steffan Meier, Buehl (DE)

(73) Assignee: Robert Bosch GmbH, Stuttgart (DE)

( * ) Notice: Subject to any disclaimer, the term of this patent is extended or adjusted under 35 U.S.C. 154(b) by 268 days.

(21) Appl. No.: 18/257,626

(22) PCT Filed: Dec. 9, 2021

(86) PCT No.: PCT/EP2021/084984
§ 371 (c)(1),
(2) Date: Jun. 15, 2023

(87) PCT Pub. No.: WO2022/128733
PCT Pub. Date: Jun. 23, 2022

(65) Prior Publication Data
US 2024/0049415 A1  Feb. 8, 2024

(30) Foreign Application Priority Data
Dec. 17, 2020 (DE) .................. 10 2020 216 110.0
Dec. 8, 2021 (DE) .................. 10 2021 213 996.5

(51) Int. Cl.
*H05K 5/06* (2006.01)
*H05K 1/18* (2006.01)
(Continued)

(52) U.S. Cl.
CPC ............ *H05K 5/066* (2013.01); *H05K 1/181* (2013.01); *H05K 5/0069* (2013.01);
(Continued)

(58) Field of Classification Search
CPC ............ H05K 1/181–187; H05K 5/00; H05K 5/0069; H05K 5/066–069; H05K 5/0247
(Continued)

(56) References Cited

U.S. PATENT DOCUMENTS 5,998,733 A * 12/1999 Smith .................. H01L 23/045
257/E23.184
6,741,036 B1 * 5/2004 Ikedo ...................... H01J 63/02
313/613
(Continued)

FOREIGN PATENT DOCUMENTS

DE 102005063280 A1 7/2007
DE 102010006689 B4 4/2013
(Continued)

OTHER PUBLICATIONS

Translation of International Search Report for Application No. PCT/EP2021/084984 dated Apr. 4, 2022 (2 pages).

*Primary Examiner* — Tuan T Dinh
(74) *Attorney, Agent, or Firm* — Michael Best & Friedrich LLP

(57) ABSTRACT

The invention relates to a control device having a casing, control electronics located in the casing, and at least one electrical feedthrough. By means of the electrical feedthrough, a current is provided for a load which is located outside the casing of the control device. The electrical feedthrough is located on the casing. The casing is fluid-tight at least in part, and the electrical feedthrough is located in a fluid-tight region of the casing. The electrical feedthrough has a metal core and an insulator surrounding the metal core. The metal core has an end face. A first bond is provided between the end face of the metal core and the control electronics, the first bond being laser-bonded at the end face.

10 Claims, 4 Drawing Sheets

(51) Int. Cl.
*H05K 5/00* (2006.01)
*H05K 5/02* (2006.01)
*H05K 7/14* (2006.01)

(52) U.S. Cl.
CPC ....... *H05K 5/0247* (2013.01); *H05K 7/14322* (2022.08); *H05K 2201/10242* (2013.01)

(58) Field of Classification Search
USPC ................ 361/752–753, 772–778, 807–810
See application file for complete search history.

(56) References Cited

U.S. PATENT DOCUMENTS

| | | | | |
|---|---|---|---|---|
| 2010/0067202 | A1* | 3/2010 | Loibl | H05K 5/0082 361/749 |
| 2016/0011020 | A1* | 1/2016 | Ehrenpfordt | G01D 11/245 73/431 |
| 2018/0178016 | A1* | 6/2018 | Frustaci | A61N 1/08 |
| 2019/0321628 | A1* | 10/2019 | Stevenson | H03H 1/00 |
| 2019/0329654 | A1* | 10/2019 | Guntermann | B60L 1/003 |

FOREIGN PATENT DOCUMENTS

| | | |
|---|---|---|
| DE | 102013208898 A1 | 11/2014 |
| DE | 102015208877 A1 | 5/2016 |
| WO | 2014049089 A1 | 4/2014 |

* cited by examiner

CONTROL DEVICE AND MANUFACTURING METHOD

BACKGROUND

The invention relates to a control device and a method for manufacturing a control device.

From the prior art, it is known to seal control devices against gaseous or liquid media with control electronics located in the control device. To provide electrical currents or voltages outside of a sealed casing of the control device, electrical feedthroughs can be used. These feedthroughs usually consist of a round metal core, wherein the round metal core is overcast with glass in order to achieve electrical insulation of the metal core against the casing. The combination of glass and metal core leads to a seal against fluids, i.e., gases or liquids. To connect the metal core to the control electronics, guide elements can be welded or soldered or attached. During soldering or welding, it can occur that cracks are formed in the glass due to the high temperatures during the welding or soldering process, so that the electrical feedthrough is not tightly sealed against gases or liquids. Even with plug connections, mechanical impacts may occur on the insulator, which lead to leaks. Furthermore, a corresponding plug element must be located on the side of the control electronics, which makes the manufacturing method more complex.

SUMMARY

One problem addressed by the invention is to provide a control device in which an electrical feedthrough is reliably connected to control electronics and, during this process, damage to an insulator of the electrical feedthrough, in particular containing glass, is unlikely. A further problem addressed by the invention is to specify a corresponding manufacturing method.

A control device has a casing, control electronics located in the casing, and at least one electrical feedthrough. By means of the electrical feedthrough, current can be provided for a load which is located outside the casing of the control device. Preferably, the load is an electrically driven compressor, and the control device preferably controls the electrically driven compressor. Preferably, the load can represent a component through which fluid flows in operation, in particular a valve or a pump.

The electrical feedthrough is located on the casing, and the casing is fluid-tight at least in part. The electrical feedthrough is located in a fluid-tight region of the casing. The electrical feedthrough has a metal core and an insulator surrounding the metal core. The metal core has an end face, wherein a first bond is provided between the end face of the metal core and the control electronics. The first bond is laser-bonded at the end face.

With the insulator surrounded by the metal core, the metal core of the electrical feedthrough is insulated against the casing, so that the current for the load can be provided well outside the casing without generating a short circuit with the casing. The casing may be completely fluid-tightly closable and may have, for example, a first casing half and a second casing half, wherein a seal is provided between the casing halves. The control device can be installed, for example in a vehicle, such that fluids, i.e., gases or liquids, can reach the casing from the outside at least in the fluid-tight region of the casing, and a penetration of the fluids in the fluid-tight region of the casing is to be prevented. The end face of the metal core can be located within the casing such that the first bond provides an electrical connection between the metal core and the control electronics and, via this first bond, the current can be passed from the control electronics outwardly to the load through the electrical feedthrough.

The insulator can contain glass and can be configured in the shape of a glass layer, for example. The glass forms an electrical and a fluid insulator. The insulator prevents fluid from flowing into the casing in the region of the electrical feedthrough. Specifically, when the load is configured as a compressor, the fluid within a load casing of the load can have a high pressure. If a part of the casing also simultaneously forms the load casing, then the fluid acts with the pressure directly on the elements in the region of the electrical feedthrough. The insulator can also contain a rubber or a ceramic. Combinations of the aforementioned materials are also possible.

The first bond can consist of a bond wire or a bond ribbon. Due to the fact that the first bond is laser-bonded at the end face, the end face is electrically connected to the first bond, wherein, due to the laser-bonding process, there is a connection region at the transition between the end face and the first bond, wherein the connection region consists of melted and resolidified material of the first bond as well as the metal core.

A method for manufacturing a control device comprises the following steps:

providing a casing, wherein the casing has at least one electrical feedthrough, wherein the casing is fluid-tight at least in part, wherein the electrical feedthrough is located in a fluid-tight region of the casing, wherein the electrical feedthrough has a metal core and an insulator surrounding the metal core, wherein the metal core has an end face;

placing control electronics in the casing;

placing a first bond between the end face of the metal core and the control electronics;

laser-bonding the first bond at the end face.

The laser-bonding of the first bond at the end face can occur in such a way that the first bond is brought into mechanical contact with the end face, and the first bond and the underlying end face are subsequently heated and partially melted with a focused laser beam. After the laser is switched off, a connection region is then formed between the first bond and the end face, wherein initially melted and subsequently resolidified material of both the first bond and the metal core is located in the connection region. This results in an electrically conductive and mechanically stable connection between the metal core and the first bond.

For example, the laser radiation used for the laser-bonding can be provided with a fiber laser having about 1000 Watts of power and 1070 nm emission wavelength. However, other types of lasers, laser powers, and wavelengths are contemplated. The laser beam can optionally be guided in a circularly oscillating manner in order to achieve a greater impact surface of the laser beam on the first bond and thus to achieve a large connection surface and a low transition resistance. The placement of the first bond and the laser-bonding can be carried out in a joint step, if necessary. For this purpose, commercial systems are available in which the first bond and the laser-bonding are carried out in one step, which have in particular the above-mentioned properties of the laser.

By the placement of the first bond and the laser-bonding the first bond with the metal core, several advantages for the control device and the manufacturing method are achieved. First, a probability of damage to the insulator, in particular a glass or a ceramic of the insulator, is reduced compared to the creation of a connection by welding or soldering process, because the temperatures occurring in the laser-bonding are significantly lower. Furthermore, the first bond can be movable to some extent, thereby compensating for manufacturing tolerances, for example of the electrical feedthrough, as well as for different thermal expansions of the electrical feedthrough and control electronics.

In one embodiment of the control device, the control electronics are located on a printed circuit board and the first bond is laser-bonded at the printed circuit board. For the manufacturing method, the first bond is thus placed on the printed circuit board and also laser-bonded at the printed circuit board analogously to the procedure of laser-bonding between the first bond and the end face of the metal core. Laser-bonding is a joining method suitable for thin workpieces, in particular bonds, preferably bond wire or bond ribbon, in the range of approximately 100 μm, so that the first bond can optionally be laser-bonded directly to the printed circuit board. This allows for a particularly simple manufacturing method.

In one embodiment of the method, a buffer plate is located on the printed circuit board. The first bond is laser-bonded at the buffer plate. The buffer plate can be a cuboid body made of a metal that is attached to the printed circuit board, for example soldered, by conventional methods. In the manufacturing method, for example, the buffer plate can be mounted and soldered onto the printed circuit board, or the buffer plate is already located on the printed circuit board of the control electronics. In both cases, the buffer plate can be configured as an SMD part and can be connected to the control electronics via SMD soldering. The buffer plate offers advantages in laser-bonding due to the fact that, firstly, a thicker metal layer (the buffer plate itself) is available for the laser-bonding process due to the buffer plate and, secondly, the buffer plate allows for an easier dissipation of the process heat generated during the laser-bonding.

In one embodiment, the printed circuit board has a thermally conductive structure in the region of the first bond. The thermally conductive structure is thermally connected to the casing and electrically insulated against the casing. In the manufacturing method, the thermally conductive structure can already be part of the printed circuit board of the control electronics. The thermally conductive structure can be formed in the shape of vias, in particular copper vias, so that a heat can be conducted through the vias. A thermal compound, for example based on silicon, can be placed between the printed circuit board and the casing. The thermal compound can have a good thermal conductivity and a poor electrical conductivity, such that, by means of the thermal compound, the thermal structure is electrically insulated against the casing without impeding the conduction of heat from the thermally conductive structure to the casing. In the manufacturing method, it can then be provided that the thermal compound is applied at this point in the casing before the control electronics are placed.

The metal core of the electrical feedthrough can be configured so as to be substantially round. This means that the metal core is configured so as to be round, in particular in the region of the insulator, and the insulator surrounds the metal core as a round sheath layer. This is easier to achieve in terms of process technology than other cross-sections of the metal core.

In one embodiment of the control device, the end face of the metal core has a pedestal protruding over the metal core. This pedestal can be formed integrally or in two pieces with the metal core. The metal core and the pedestal can thus be manufactured from one workpiece or manufactured from two different workpieces and connected to one another. In this case, the end face of the metal core is the end face of the pedestal. As a result, an application surface of the electrical feedthrough can be increased and, if applicable, laser-bonding of the first bond at the end face can be simplified.

In one embodiment of the control device, the electrical feedthrough is configured such that the current supplied for the load is greater than 1 ampere, in particular greater than 10 amperes, and preferably in the range of 100 amperes. In this case, at least one bond, in particular at least one bond wire and/or at least one bond ribbon, is in any case to be provided for higher currents, in particular in the range of 10 or more amperes, because bond wires are no longer suitable for these high currents. For particularly high currents in the range of 100 amperes, it can additionally be provided that the first bond has more than a single bond ribbon or a single bond wire, in particular two or more. This is particularly simple to carry out when the buffer plate is used on the printed circuit board, because the buffer plate then provides a sufficiently large surface area for the mounting of the first bonds. In this embodiment, if applicable, the use of the pedestal of the metal core is also advantageous in order to increase an existing surface area in the region of the electrical feedthrough.

In one embodiment of the control device, a current supply is passed through the casing. The control electronics are connected to the current supply by means of a second bond, wherein the second bond is laser-bonded at the current supply and at the control electronics. The current supply can also be configured in the form of electrical feedthroughs, but also in the form of conventional plugs, depending on whether the casing is designed so as to be fluid-tight in the region of the current supply or not. It can also be provided that a buffer plate on a circuit board of the control electronics is provided in the region of the current supply in order to utilize the advantages of the buffer plate in the region of the current supply as described in connection with the first bond. In the manufacturing method, the second bond is placed at the current supply and the control electronics and is also laser-bonded as described for the first bond. In particular, it is advantageous that the laser-bonding of the first bond and the laser-bonding of the second bond can be done in one work step, i.e., in particular within one machine.

Furthermore, signal plugs can additionally be provided on the casing, with which the control electronics can receive control signals from the outside or can input measured values from sensors. These signal plugs can also be laser-bonded at the control electronics in order to also enable the electrical connection of the signal plugs with the control electronics in one work step.

In one embodiment of the control device, the metal core consists of copper or iron. Copper is well-suited as a material for laser-bonding processes, wherein the metal core can contain, for example, pure copper having at least 99.99 percent purity, but also certain copper alloys. Such a copper alloy can have, for example, between 0.7 and 1.4 percent by weight chromium and low amounts of zirconium in addition to the copper. The rest of the alloy is copper. If the metal core consists of iron, in particular iron-nickel alloys can be provided, for example having between 45 and 55 percent by mass iron, between 45 and 55 percent by mass nickel, and up to 0.5 percent by mass silicon. These materials are also suitable for the laser-bonding process. The selection is made based on the thermal expansion and the electrical conductivity. The thermal expansion must be similar to the thermal expansion of the insulator and/or the metal plate. The aforementioned iron-nickel alloy has these advantageous properties. In one embodiment of the control device, the first bond consists of copper or aluminum. In particular, copper ribbons having a cross-section of 2 mm to 0.2 mm or 2 mm to 0.3 mm, or cross-sections of a similar magnitude, or aluminum ribbons of the same magnitude, are well suited for creating a laser bond with the metal core. If a second bond to the current supply is provided, it can consist of the same material as the first bond.

In one embodiment of the control device, the control electronics has a motor control. The motor control is configured so as to provide three-phase actuation of the load configured as a motor. To enable this, at least one electrical feedthrough is provided for each motor phase, each of which is connected to the control electronics by means of first bonds. Preferably, more or less can also be formed, in particular two, four, or six electrical feedthroughs. Thus, three electrical feedthroughs are located in the casing, each connected to the control electronics by means of a first bond, and each being laser-bonded at the metal core of the associated electrical feedthrough as well as the control electronics. The three electrical feedthroughs can serve to provide one of the three phases, also designated with the letters UVW, respectively. Instead of the three-phase actuation, a different multi-phase actuation can also be provided, wherein a separate electrical feedthrough can be provided for each of the phases of the multi-phase actuation. In particular, electrically driven compressors that are electrically commutated have three phases and thus electrical feedthroughs.

In particular, a motor can be provided as the load, wherein it can be provided that the motor drives a compressor, a fan, a pump, a window regulator, or an expansion valve for a refrigerant. The motor and the compressor can, for example, be exposed to a gas or a liquid that must not enter the control electronics, so that an advantageous configuration can be achieved by the aforementioned sealing of the casing. Preferably, a compressor or valve has a high-pressure fluid. This fluid must not enter the casing. The same applies when an expansion valve for a refrigerant can be driven by means of the control device, because the refrigerant could possibly also be harmful to the control electronics. Also when used in a hydrogen system, the hydrogen must not enter the casing. The control device according to the invention is further possible as a transmission control, wherein elements to be driven can be located outside the casing within the transmission and thus can be exposed to the transmission oil, wherein the transmission oil also must not enter the control device or the casing of the control device. The control device can further be advantageously used with the inverter of an electric vehicle.

BRIEF DESCRIPTION OF THE DRAWINGS

Exemplary embodiments of the invention are explained with reference to the following drawings. In the schematic drawings, the following are shown.

DETAILED DESCRIPTION

Figure 1:
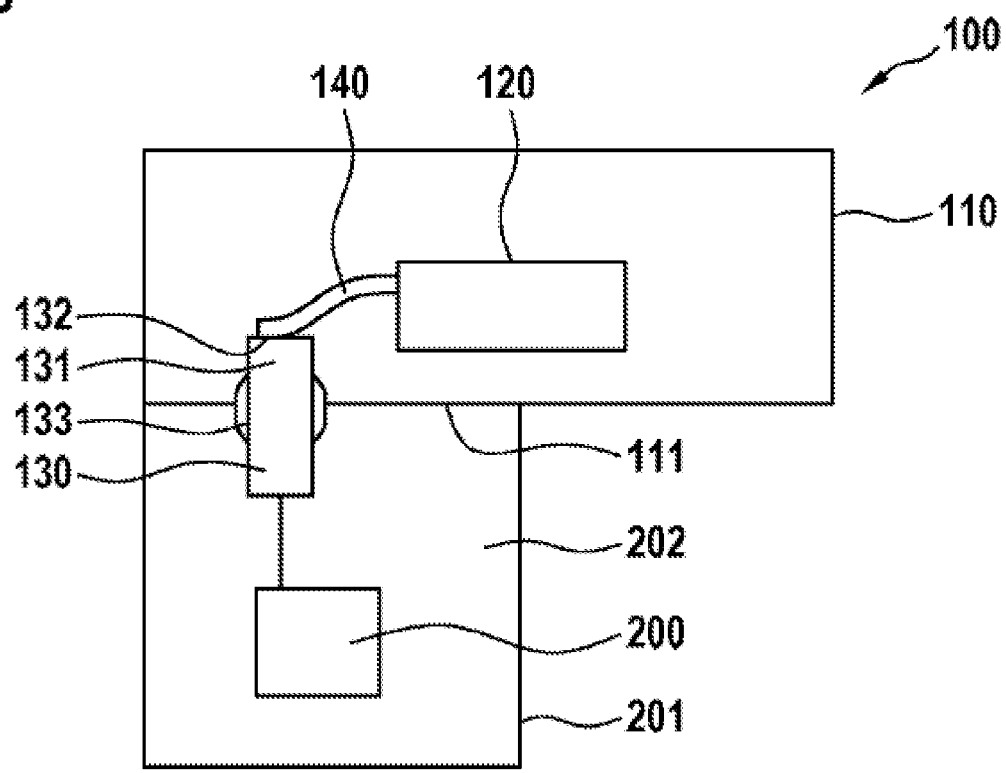
FIG. 1 a cross-section through a control device with a load.

FIG. 1 shows a cross-section through a control device 100 having a casing 110 and control electronics 120 located in the casing 110. Adjacent to the casing 110, a load 200 is located in a load casing 201 having a load casing interior 202. The load is in particular an electrically driven compressor. In a compressor, there is a fluid, in particular gaseous, within the load casing interior 202 and the pressure of the fluid can be greatly increased in relation to the pressure within the casing 110. The casing 110 further has an electrical feedthrough 130, wherein current can be provided to the load 200 located outside of the casing 110 by means of the electrical feedthrough 130. The casing 110 is fluid-tight at least in part, and the electrical feedthrough 130 is located in a fluid-tight region 111 of the casing 110. Thus, in the fluid-tight region 111, the casing 110 is fluid-tight against fluids located within the load casing interior 202, such as liquids or gases.

The electrical feedthrough 130 has a metal core 131 having an end face 132, wherein the end face 132 is located inside the casing 110. Preferably, the metal core is cylindrical. The electrical feedthrough 130 further has an insulator 133 surrounding the metal core 131, wherein electrical insulation of the metal core 131 against the casing 110 is achieved by the insulator 133. Preferably, the insulator 133 coaxially surrounds the metal core. A first bond 140 is provided between the control electronics 120 and the end face 132 of the metal core 131. The first bond 140 can be configured as a bond wire or bond ribbon and serves to guide a current from the control electronics 120 to the feedthrough 130 and further on to the load 200. The first bond 140 is laser-bonded at the end face 132. This means that the material of the first bond 140 is placed on the end face 132 and subsequently illuminated by a laser. By the laser irradiation, a connection region is created by interconnecting the metal core 131 and the first bond 140. It is advantageous that the bond does not damage the insulator 133. Such a damage can lower the fluid tightness, which can allow fluid to enter the casing 110. Also, only a low force and heat input is necessary in the manufacturing of the bond.

The insulator 133 can consist of glass, rubber, or ceramic, or a combination of these materials. Advantageously, the insulator 133 is formed from glass. The glass causes an electrical insulation and an insulation against the ingress of fluid. The insulator 133 can in particular be configured as a glass layer or a ceramic layer.

Figure 2:
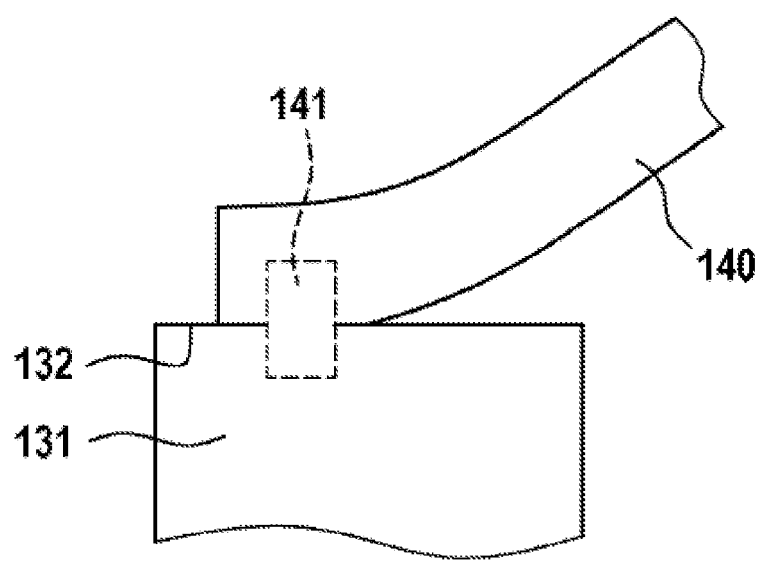
FIG. 2 an enlargement of a connection between a metal core and a first bond.

FIG. 2 shows an enlarged section of the connection between the first bond 140 and the metal core 131. A connection region 141 extends from the metal core 131 to the first bond 140. During the laser-bonding, material of the metal core 131 and the first bond 140 is melted by the energy of the radiated laser and solidified to the connection region 141 upon deactivation of the laser, wherein material of both the metal core 131 and the first bond 140 is located in the connection region 141. To illustrate this, the connection region 141 is shown by a dashed line. Preferably, the laser-bonding allows a bonding region that protrudes into the bond 140 as much as into the metal core. The laser-bonding allows a well-dosable and targeted amount of energy to be used.

Figure 3:
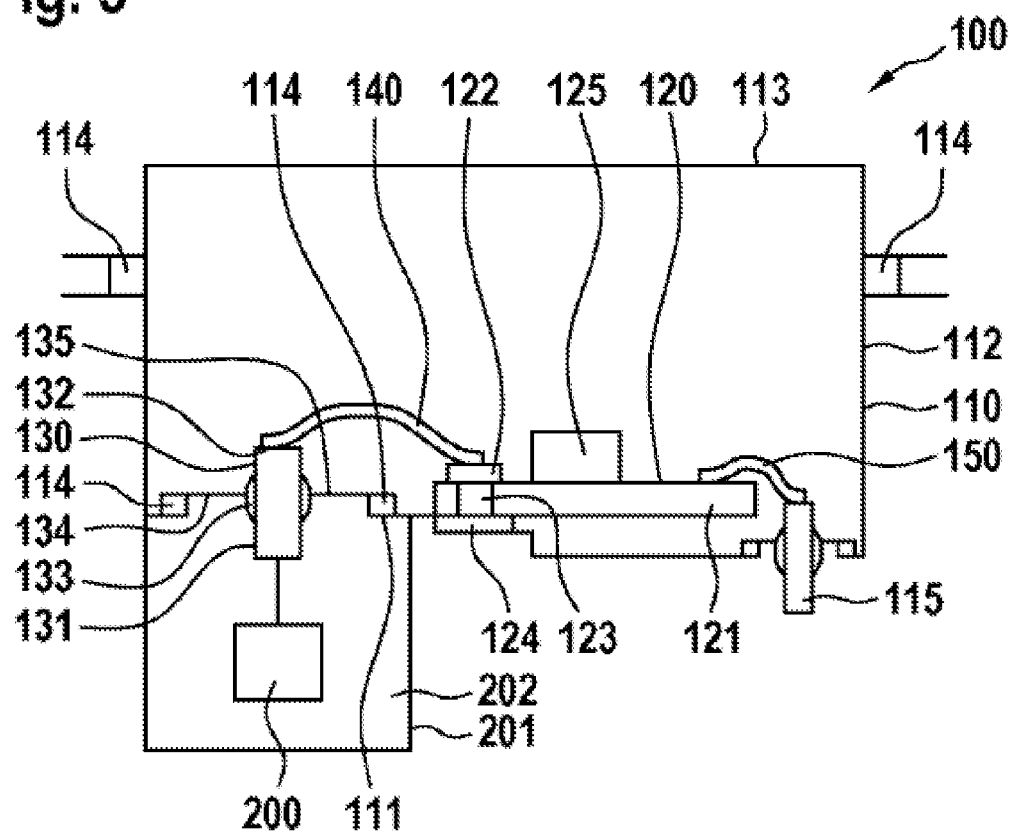
FIG. 3 a cross-section through a further control device.

FIG. 3 shows a cross-section through a further exemplary embodiment of a control device 100, which basically corresponds to the control device 100 of FIG. 1, but has further optional features. The individual additional features described below are also individually additionally implementable in the control device 100 of FIG. 1. Various such exemplary embodiments, optionally also implementable in the control device 100 of FIG. 1, are described below.

The control electronics 120 are located on a printed circuit board 121 in one exemplary embodiment. A printed circuit board is understood to mean a circuit carrier, in particular a carrier of electronic components. The printed circuit board consists of epoxy resin, paper, fiber-reinforced plastic, ceramic substarts (DBC, LTCC, LCTC), or insulated metal (IMS). Accordingly, the printed circuit board is configured as a DBC, LTCC, LCTC, IMS printed circuit board. The first bond 140 is laser-bonded at the printed circuit board 121. This can be done, for example, by laser-bonding the first bond 140 on a conductor path of the printed circuit board 121. Thus, the first bond 140 can be laser-bonded directly to the printed circuit board 121.

In one exemplary embodiment, as shown in FIG. 3, a buffer plate 122 is located on the printed circuit board 121 and the first bond 140 is laser-bonded at the buffer plate 122. In particular, the buffer plate 122 provides a greater material thickness, so that the laser-bonding process can be easier to configure with a connection region analogous to FIG. 2.

It is also shown in FIG. 3, as a further exemplary embodiment, that the printed circuit board 121 has a thermally conductive structure 123 in the region of the first bond 140. The thermally conductive structure 123 can consist of vias guided through the printed circuit board 121. The thermally conductive structure 123 is thermally conductively connected to the casing 110 and electrically insulated against the casing 110. This can be done, for example, by a thermally but not electrically conductive thermal compound 124 being provided between the printed circuit board 121 and the casing 110 in the region of the thermally conductive structure 123. The thermal compound 124 can contain silicon.

In one exemplary embodiment, as shown in FIG. 3, the casing 110 is produced of a bottom part 112 having the fluid-tight region 111 with the electrical feedthrough 130 and a lid 113. A seal 114 is located between the lid 113 and the bottom part 112, such that the entire casing 110 can be fluid-tight.

In one exemplary embodiment, the electrical feedthrough 130 is configured as a feedthrough device 135 with a metal plate 134. The metal core 131 with the insulator 133 is located on the metal plate 134 and attached to the fluid-tight region 111 of the casing 110 with a seal 114. This allows the feedthrough device 135 to be optionally removably positioned on the casing 110 and thus to replace defective electrical feedthroughs 130.

The metal plate 134 for each electrical feedthrough 130 has in particular a recess, in particular a cylindrical, continuous recess, preferably a bore. The electrical feedthrough 130 is guided through the recess. The recess is in particular configured as a continuous recess. If no metal plate is configured, a corresponding recess is configured in the casing. By way of example, the metal plate 134 in FIG. 3 forms part of the casing 110 of the control device 100 and part of the load casing 201 of the load 200 at the same time. The metal plate in turn closes a recess in the casing 110. Preferably, it closes a recess between the housings 110 of the control device and the load casing 201. Advantageously, the metal plate 134 can be manufactured with the electrical feedthroughs 130 and the insulator 133 and then inserted as a part into the recess provided for this purpose. In particular, the metal plate is attached to one or both housings by means of welding, soldering, gluing, screwing, riveting. The metal plate is sealed via a further insulator, in particular a sealing ring or also glass.

An insulator 133 is formed around the metal core 131 of the electrical feedthrough 130. The insulator is particularly coaxially formed around the metal core 131. The insulator is at least in part liquefied after being positioned within the recess. As a result, the insulator closes the open region around the metal core 131. The insulator 133 closes openings and open regions between the recess and the metal core 131.

In one exemplary embodiment, the casing 110 additionally has a current supply 115 guided through the casing 110. The current supply 115 is configured with a plate, in particular a metal plate, a metal core, and an insulator 133, analogously to the electrical feedthrough 130. This is particularly advantageous in combination with the already described exemplary embodiment with the completely fluid-tight casing 110, because, in this case, a seal against fluids is also possible in the region of the current supply 115. If the casing 110 is only fluid-tight in the fluid-tight region 111, a conventional, non-fluid-tight plug can optionally be installed instead of the current supply 115 shown in FIG. 3. The control electronics 120 are connected to the current supply 115 by means of a second bond 150. The second bond 150 is laser-bonded at the current supply 115. Furthermore, it can likewise be provided that the second bond 150 is also laser-bonded at the control electronics 120, in particular the printed circuit board 121. Also optionally, an additional buffer plate 122 can also be provided here.

The printed circuit board 121 of the control electronics 120 additionally has electronic components 125 that can serve to control the load 200.

In the control devices 100 shown in FIGS. 1 to 3, it can be provided that the metal core 131 consists of copper or iron. In particular, the metal core 131 can be formed from pure copper of at least 99.99 percent copper content or from a copper alloy having 0.7 to 1.4 percent chromium and a low proportion of zirconium. The alloy must have a thermal expansion similar to the insulator 133 as well as a high conductivity. Different thermal expansions lead to shifting of the insulator. Low conductivity leads to an increase in the cross-section. The alloys listed herein meet the specifications in an inventive manner. Furthermore, the metal core 131 can be configured as an iron-nickel alloy, in particular having an iron content of between 45 and 55 percent and a nickel content of between 45 and 55 percent as well as up to 0.5 percent silicon as alloy constituents. For example, an alloy of 52 percent nickel and 48 percent iron can be provided without silicon. Alternatively, an alloy having between 50.8 and 51.2 percent nickel, between 48.8 and 49.2 percent iron, and up to 0.3 percent silicon can be provided. The percentages can refer to mass percents.

The buffer plate 122 can be constructed of the same materials as the metal core 131, and in particular can consist of copper.

The first bond 140 can consist of copper or aluminum. The second bond 150 can also consist of copper or aluminum.

Figure 4:
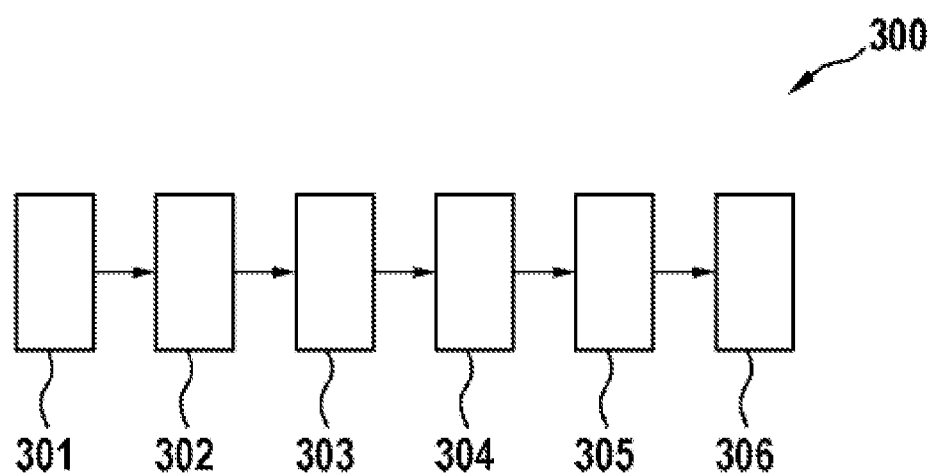
FIG. 4 a flowchart of a manufacturing method.

FIG. 4 shows a flowchart 300 of the method for manufacturing a control device 100 as shown in FIG. 1 or 3. In a first method step 301, the casing 110 is provided. The casing 110 has the electrical feedthrough 130 and is in part fluid-tight, wherein the electrical feedthrough 130 located in a fluid-tight region 111 of the casing 110. The electrical feedthrough 130 has a metal core 131 and an insulator 133 surrounding the metal core 131, wherein the metal core 131 further has an end face 132. In the first method step 301, it can be provided that the electrical feedthrough 130, configured as a feedthrough device 135, is first inserted into the casing 110. The feedthrough device 135 has the electrical feedthroughs 130 and the insulator 133. The feedthrough device 135 has a recess, in particular a cylindrical, continuous bore, into which an electrical feedthrough 130 is inserted. The insulator 133 is melted, thereby fluidly sealing the region between the metal core of the electrical feedthrough 130 and the metal plate.

If the casing 110 is configured with a bottom part 112 and a lid 113 as shown in FIG. 3, it can be provided that only the bottom part 112 of the casing 110 is initially provided, and the lid 113 is only attached after further method steps. In a second method step 302, the control electronics 120 are placed in the casing 110 and fixed or screwed, for example. In a third method step 303, the first bond 140 is located between the end face 132 and the control electronics 120.

In a fourth method step 304, the first bond 140 is laser-bonded at the end face 132, thereby forming the connection region 141 shown in FIG. 2. In an optional fifth method step 305, the first bond 140 can also be laser-bonded at a printed circuit board 121 or buffer plate 122.

In an optional sixth method step 306, the second bond 150 of FIG. 3 can be located between the control electronics 120 and the current supply 115 and can also be laser-bonded, wherein additionally a laser-bonding of the second bond 150 is also possible at the control electronics 120 and the printed circuit board 121, respectively.

Figure 5:
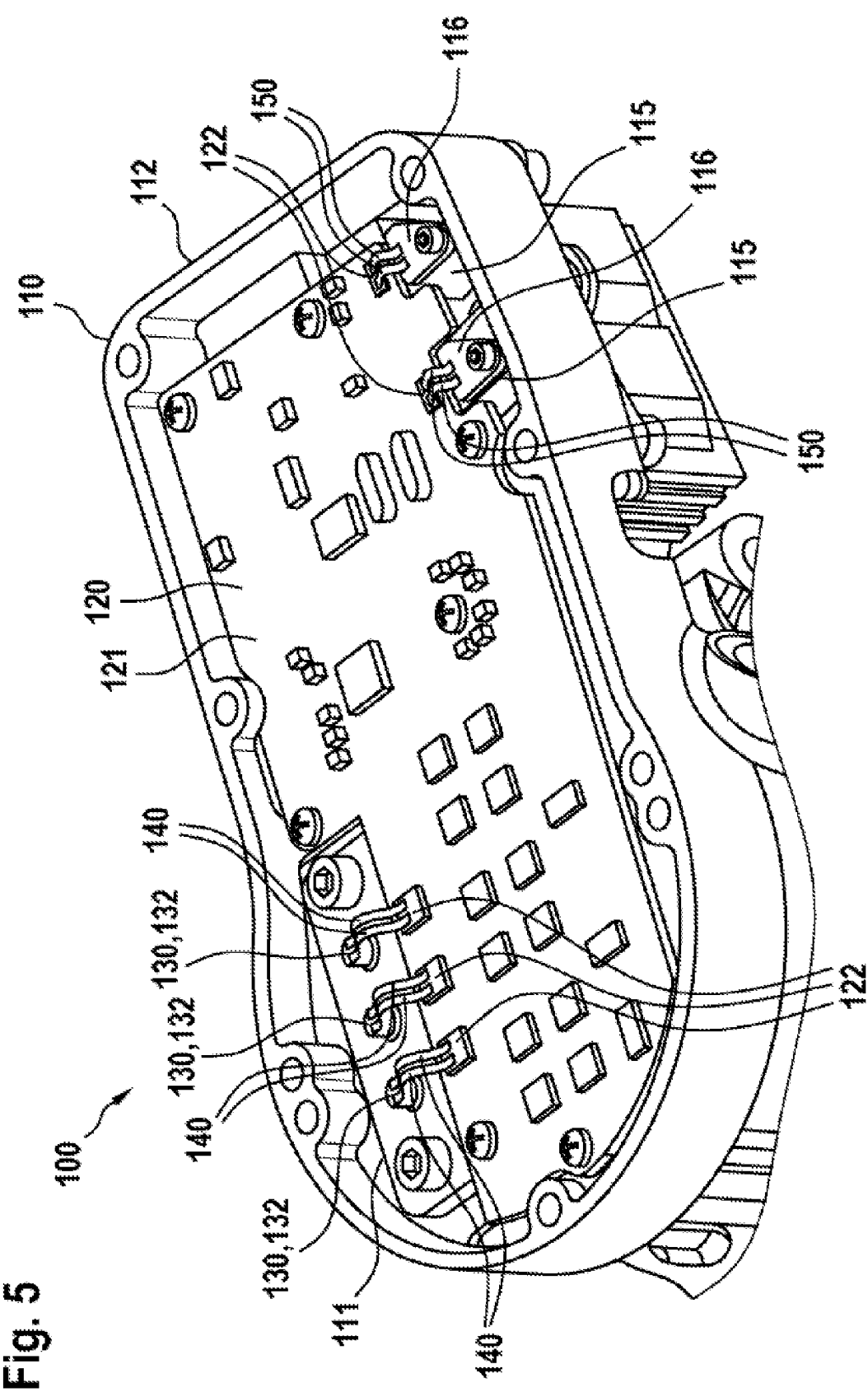
FIG. 5 an isometric view of a control device.

FIG. 5 shows an isometric view of a control device 100, wherein the casing 110 has a bottom part 112 as in FIG. 3 and, so that the components located within the casing 110 are visible, the lid 113 shown in FIG. 3 is omitted. Of course, a lid 113 can be placed on the bottom part 112 of the casing 110 analogously to FIG. 3. The control electronics 120 in turn have a printed circuit board 121. The control electronics 120 have a motor control. The motor control is configured so as to perform a three-phase actuation of the load 200 configured as a motor. To enable this, three electrical feedthroughs 130 are provided, each having an end face 132 and each connected to two first bonds 140 with a buffer plate 122 on the printed circuit board 121. A laser bond is configured between the first bonds 140 and the feedthroughs 130, as well as between the first bonds 140 and the buffer plate 122, respectively, as already described. For each electrical feedthrough 130, two first bonds 140 are provided in order to be able to increase a total current flowing through the electrical feedthroughs 130.

The first bonds 140 are each configured as bond ribbons in the exemplary embodiment shown in FIG. 5. For example, such bond ribbons can have a cross-section of 2 mm to 0.3 μm and are thus also suitable for high currents. In particular, it can be provided that currents greater than 1 ampere flow through the electrical feedthroughs 130 (for example, also in the exemplary embodiments of FIGS. 1 and 3). For motor controls, it can in particular also be provided that the currents are greater than 10 amperes or even in the range of 100 amperes. In particular, two first bonds 140 per electrical feedthrough 130 are provided in order to enable 100 amperes through the electrical feedthroughs 130. Below the buffer plates 122, the thermally conductive structures already described in connection with FIG. 3 are provided with a good thermal connection to the casing 110 and electrical insulation against the casing 110. With the currents typically flowing for motor control in the range of 100 amperes, it can be achieved that, in operation, the first bonds 140 can heat up to a maximum of 200° C. and the buffer plates 122 can heat up to a maximum of 100° C. and thus the required currents can be provided without destruction of the components.

The bottom part 112 of the casing 110 additionally has two poles of a current supply 115, each having a metal plate 116 at its upper end. The metal plates 116 are each connected to two second bonds 150 with buffer plates 122 of the printed circuit board 121, wherein the second bonds 150 are laser-bonded at the metal plates 116 and the buffer plates 122, respectively. Here, too, two second bonds 150 are provided in order to be able to accommodate the present currents.

Figure 6:
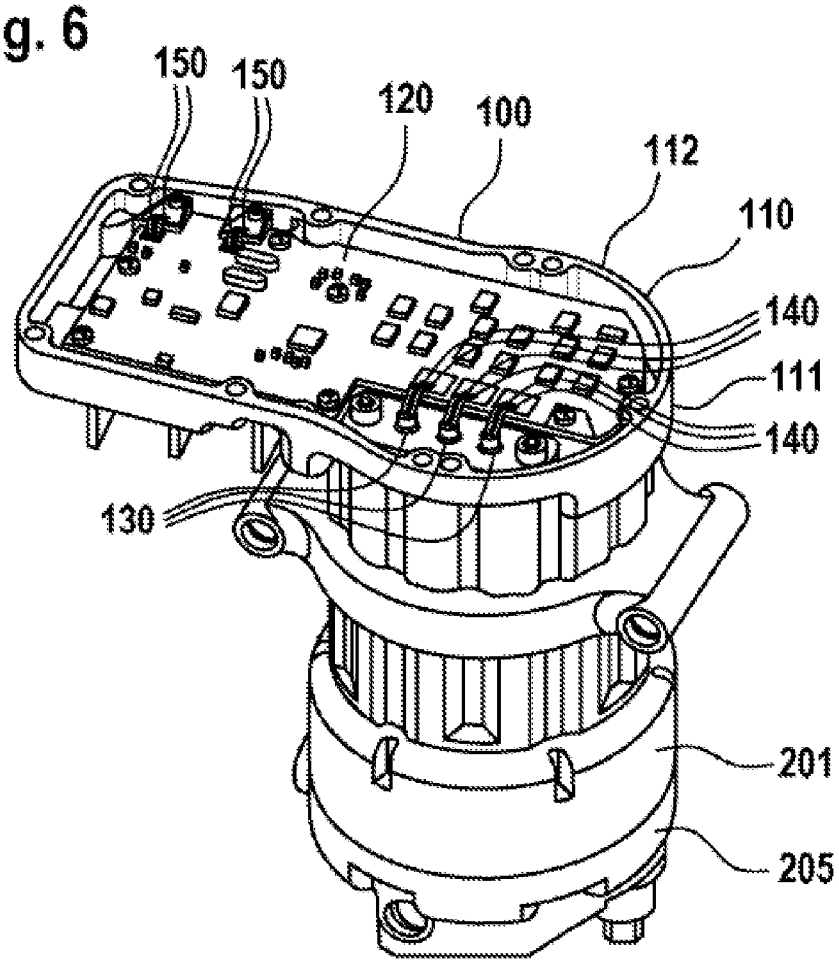
FIG. 6 an isometric view of a compressor.

FIG. 6 shows an isometric view of the control device 100 of FIG. 5 mounted on a load 200. The load 200, not shown due to the load casing 201, is configured as an electric motor and is used in order to drive a compressor 205. The load is an electric motor that drives the compressor 205. The gas flowing through the compressor 205 enters the load casing 201 and is shielded from the interior of the casing 110 by the electrical feedthroughs 130 and the fluid-tight region 111 of the casing 110. Thus, gases compressed with the compressor 205 that are harmful for the control electronics 120 cannot reach the control electronics 120. The lid 113 is also not shown in FIG. 6, as in FIG. 5.

Instead of the electric motor and compressor 205, as shown in FIGS. 5 and 6, the load 200 can also have a valve, for example an expansion valve for a refrigerant. Also, the load can represent part of a fuel cell, for example a hydrogen valve or a hydrogen pump. Furthermore, an electric motor can be provided, which is actuated by the control electronics 120 and drives a fan or a coolant pump, wherein the gas or coolant moved by the fan also cannot pass to the control electronics 120, and therefore the fluid-tight region 111 must also be provided. Alternative consumers can also be, for example, actuators in an automatic transmission, a current window motor, a pump, for example a gasoline pump, or an inverter of an electric vehicle. These components can also be exposed to fluids that must not be passed to the control electronics 120.

Figure 7:
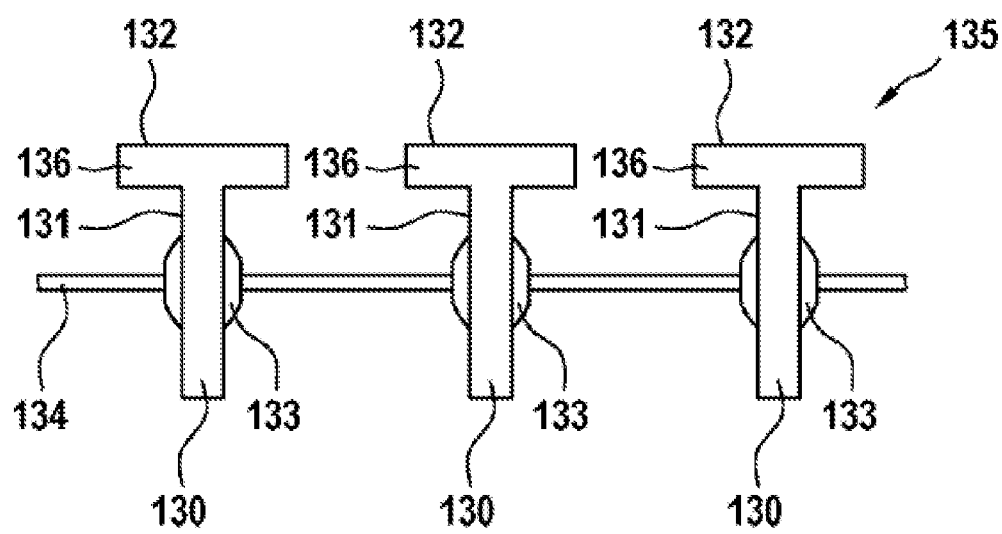
FIG. 7 a feedthrough component.

FIG. 7 shows a feedthrough device 135, as can be used in control device 100 of FIGS. 5 and 6. The feedthrough device 135 has three electrical feedthroughs 130, each having a metal core 131 and an insulator 133 inserted into a metal plate 134. The end face 132 has a pedestal 136 protruding over the metal core 131. This is particularly advantageous when the metal core 131 has a diameter that optionally does not allow for two or more first bonds 140 to be placed at the end face 132. With the pedestal 136 protruding over the metal core 131, a surface of the end face 132 is increased. The pedestal 136 can be formed integrally with the metal core 131 or can be welded to the metal core 131 or connected to the metal core 131. However, in each case, the end face 132 refers to the end face of the overall component consisting of the metal core 131 and the pedestal 136.

In addition to the electrical feedthroughs 130 and current supplies 115 shown in the figures, it can be provided that signal plugs are located on the casing 110, which are also connected to the control electronics 120 within the casing 110 by means of a laser-bonding process. This enables an overall connection of the control electronics with all relevant components in one work step by means of the laser-bonding process. In particular, the electrical feedthroughs 130 having a metal core 131 and insulator 133 are not susceptible to destruction during the laser-bonding process, such that even after laser-bonding, the electrical feedthroughs 130 are fluid-tight. This enables manufacturing advantages compared to welding, soldering, and plug methods.

Although the invention has been described in more detail using preferred exemplary embodiments, the invention is not limited by the disclosed examples, and other variations can be derived from this by a person skilled in the art without departing from the scope of protection of the invention.

What is claimed is:

1. A control device (100) comprising a casing (110), control electronics (120) located in the casing (110), and at least one electrical feedthrough (130), wherein, by the electrical feedthrough (130), a current is provided for a load (200) which is located outside the casing (110) of the control device (100), wherein the electrical feedthrough (130) is located on the casing (110), wherein the casing (110) is fluid-tight at least in part, wherein the electrical feedthrough (130) is located in a fluid-tight region (111) of the casing (110), wherein the electrical feedthrough (130) has a metal core (131) and an insulator (133) surrounding the metal core (131), wherein the metal core (131) has an end face (132), wherein a first bond (140) is provided between the end face (132) of the metal core (131) and the control electronics (120), wherein the first bond (140) is laser-bonded at the end face (132), wherein the control electronics (120) is located on a printed circuit board (121) and the first bond (140) is located on the printed circuit board (121), wherein a buffer plate (122) is located on the printed circuit board (121) and the first bond (140) is laser-bonded at the buffer plate (122), wherein the printed circuit board (121) has a thermally conductive structure (123) in a region of the first bond (140), wherein the thermally conductive structure (123) is thermally conductively connected to the casing (110), wherein the thermally conductive structure (123) is electrically insulated against the casing (110).

2. The control device (100) according to claim 1, wherein the end face (132) has a pedestal (136) protruding over the metal core (131).

3. The control device (100) according to claim 1, wherein a current supply (115) is passed through the casing (110) and wherein the control electronics (120) is connected to the current supply (115) by a second bond (150), wherein the second bond (150) is laser-bonded at the current supply (115) and at the control electronics (120).

4. The control device (100) according to claim 1, wherein the metal core (131) includes copper or iron.

5. The control device (100) according to claim 1, wherein the first bond (140) includes copper or aluminum.

6. The control device (100) according to claim 1, wherein the control electronics (120) has a motor control, wherein end faces (132) of three electrical feedthroughs (130) are connected to the control electronics (120) by first bonds (140), and wherein the motor control is configured to carry out a three-phase actuation of the load (200) via the three electrical feedthroughs (130).

7. The control device (100) according to claim 1, wherein the insulator (133) is formed from glass.

8. The control device (100) according to claim 1, wherein the load (200) is configured as a compressor having a compressor casing, and wherein there is increased pressure within the compressor.

9. A method for manufacturing a control device (100), wherein the method comprises the following steps:
    providing (301) a casing (110), wherein the casing (110) has at least one electrical feedthrough (130), wherein the casing (110) is fluid-tight at least in part, wherein the electrical feedthrough (130) is located in a fluid-tight region (111) of the casing (110), wherein the electrical feedthrough (130) has a metal core (131) and an insulator (133) surrounding the metal core (131), wherein the metal core (131) has an end face (132);
    placing (302) control electronics (120) in the casing (110) and positioning the control electronics (120) on a printed circuit board (121);
    positioning a buffer plate (122) on the printed circuit board (121);
    placing (303) a first bond (140) between the end face (132) of the metal core (131) and the control electronics (120), wherein the first bond (140) is positioned on the printed circuit board (121), wherein the printed circuit board (121) has a thermally conductive structure (123) in a region of the first bond (140), wherein the thermally conductive structure (123) is thermally conductively connected to the casing (110), wherein the thermally conductive structure (123) is electrically insulated against the casing (110); and
    laser-bonding (304) the first bond (140) at the end face (132) and the buffer plate (122).

10. The control device (100) according to claim 1, wherein the insulator (133) seals the casing (110) against an ingress of fluid in a region of the electrical feedthrough (130).

* * * * *